(12) United States Patent
Kania

(10) Patent No.: US 6,704,894 B1
(45) Date of Patent: Mar. 9, 2004

(54) FAULT INSERTION USING ON-CARD REPROGRAMMABLE DEVICES

(75) Inventor: Michael J. Kania, Endicott, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 415 days.

(21) Appl. No.: 09/745,778

(22) Filed: Dec. 21, 2000

(51) Int. Cl.$^7$ .................. G01R 31/28; G06F 11/00; H02H 3/05
(52) U.S. Cl. ............... 714/724; 714/725; 714/727; 714/25; 714/41
(58) Field of Search ............... 714/724, 725, 714/727, 41, 25

(56) References Cited

U.S. PATENT DOCUMENTS

| | | |
|---|---|---|
| 4,156,132 A | 5/1979 | Hazzard |
| 4,829,520 A | 5/1989 | Toth |
| 4,835,459 A * | 5/1989 | Hamlin et al. ............. 324/73.1 |
| 4,999,837 A | 3/1991 | Reynolds et al. |
| 5,173,906 A | 12/1992 | Dreibelbis et al. |
| 5,384,275 A | 1/1995 | Sakashita |
| 5,428,624 A | 6/1995 | Blair et al. |
| 5,559,744 A | 9/1996 | Kuriyama et al. |
| 5,561,762 A * | 10/1996 | Smith et al. .................. 714/33 |
| 5,574,692 A | 11/1996 | Dierke |
| 5,577,050 A | 11/1996 | Bair et al. |
| 5,592,422 A | 1/1997 | McClure |
| 5,596,537 A | 1/1997 | Sukegawa et al. |
| 5,640,354 A | 6/1997 | Jang et al. |
| 5,651,013 A | 7/1997 | Iadanza |
| 5,661,729 A | 8/1997 | Miyazaki et al. |
| 5,675,545 A | 10/1997 | Madhavan et al. |
| 5,737,342 A | 4/1998 | Ziperovich |
| 5,841,790 A | 11/1998 | Salem et al. |
| 5,844,917 A | 12/1998 | Salem et al. |
| 5,848,238 A | 12/1998 | Shimomura et al. |
| 5,878,051 A | 3/1999 | Sharma et al. |
| 5,883,843 A | 3/1999 | Hii et al. |
| 5,896,401 A * | 4/1999 | Abramovici et al. ........ 714/741 |
| 5,912,901 A | 6/1999 | Adams et al. |
| 5,914,902 A | 6/1999 | Lawrence et al. |
| 5,946,249 A | 8/1999 | Georgakos et al. |
| 5,974,579 A | 10/1999 | Lepejian et al. |
| 6,020,758 A * | 2/2000 | Patel et al. .................... 326/40 |
| 6,536,008 B1 * | 3/2003 | Nadeau-Dostie et al. ... 714/726 |
| 6,560,720 B1 * | 5/2003 | Chirashnya et al. .......... 714/32 |

* cited by examiner

Primary Examiner—Albert DeCady
Assistant Examiner—Esaw Abraham
(74) Attorney, Agent, or Firm—Perkins, Smith & Cohen LLP; Jacob N. Erlich; Jerry Cohen

(57) ABSTRACT

A method of inducing a fault within the boundary of an on-card reprogrammable logic device (RLD) by interactive injection of subtle candidate faults and comparison of expected error message from software diagnostics until all faults are tested. Upon completion of fault injection, the RLD is reprogrammed to its proper functional faultless state.

16 Claims, 3 Drawing Sheets

FAULT INSERTION USING ON-CARD REPROGRAMMABLE DEVICES

STATEMENT OF GOVERNMENT INTEREST

The U.S. Government has a paid-up license in this invention and the right in limited circumstances to require the patent owner to license others on reasonable terms as provided for by the terms of Contract No. N00024-94-D-5204 awarded by the Department of the Navy.

BACKGROUND OF THE INVENTION

This invention relates generally to fault insertion as applied to electronic integrated circuits, and, more particularly to field fault insertion with respect to reprogrammable logic devices.

To ensure that a circuit board performs to specification, it is commonplace to intentionally inject faults, bugs or errors into the system to simulate a potential component failure problem during performance, and determine if system diagnostics detect the problem and respond in an appropriate manner by, for example, switching in redundant hardware to take over the functionality of the failed component.

Fault insertion usually takes the form of short-circuiting pins on computer chips that are, used on printed wiring boards (PWB) to perform certain logic functions. The problems associated with this traditional method are many. First, by today's standards, leaded pins on these chips have very small dimensions. Short-circuiting them can be time consuming, may be difficult depending upon where the PWB is located within the system and can be dangerous to the chip itself if the pin on the chip cannot sustain a short-circuit. Wires may have to be attached to the small-pitch pins for purposes of short-circuiting them. This requires rework to the PWB, is time-consuming and could potentially damage the PWB or chip itself. The problem is becoming more severe with the move toward smaller-pitch packaging such as ball grid arrays (BGA's) where the pins of the package are under the package itself and may be unreachable from the back side of the PWB. Also, space-constrained designs make gaining access to the pins difficult.

Prior art also deals with injecting non-catastrophic errors, or faults, into hardware, with the intent of detecting the error in some manner. Some of the prior art approaches are specific to particular types of hardware e.g. memory, application specific integrated circuits (ASICs), processors, hard storage disks, etc.), which is a limiting factor. Also, most of these prior art methods require special "additional" hardware or an apparatus to assist with the error injection and detection. Some prior methods may require software to "switch on" special hardware. Thus, prior art methods have limitations of various types.

New computer chips are presently available that allow a chip designer to create and change the function of the chips at the convenience of the chip designer's site location. The latest version of these computer chips is called the on-card field Reprogrammable Logic Device or RLD. The field reprogrammable feature of the RLD gives the chip designer the ability to change the function of the chip without having the chip vendor involved in the process. This results in a computer chip that can be tailored to meet a wide variety of needs in a short period of time. The on-card capability means that the chip does not have to be unsoldered from the printed wiring board (PWB), reprogrammed while off the PWB, then resoldered to the PWB. To perform the reprogramming, chip vendors have utilized an interface called boundary scan. The boundary scan interface, sometimes referred to as the JTAG (Joint Test Action Group) interface after the organization that defined it, allows for many RLDs to be connected in a chain. This yields a single path whereby all RLDs on a PWB can be reprogrammed singularly or all at once. By connecting peripheral equipment to the JTAG interface on the PWB, a chip designer can "re-personalize" the RLDs by loading in a different code set, thereby changing the function of these devices.

It is therefore an object of this invention to overcome certain of the aforesaid limitations associated with fault insertion.

It is a further object of this invention to advantageously utilize the flexibility of reprogrammable logic devices or RLDs to enhance fault insertion methodology.

SUMMARY OF THE INVENTION

The objects set forth above as well as further and other objects and advantages of the present invention are achieved by the embodiments of the invention described hereinbelow which utilize the latest computer chip technology, namely field reprogrammable logic devices (RLDs), and applies it to solving some of the drawbacks of the traditional method of short-circuiting pins for fault insertion discussed above.

The present invention involves reprogramming an on-card RLD to insert a functional fault. If reprogramming is performed in this subtle way, the circuit card on which this RLD resides will power up successfully to a point where software diagnostics can then be executed. Most well written software diagnostics will then encounter the fault and report it. Instead of faulting at the external boundaries of the device as with traditional methods of short-circuiting pins, faulting occurs with the present methodology within the boundary of the device.

This invention does not require additional "test" hardware or software to assist in the injection of the bug or fault. Furthermore, software diagnostic programs have already been written, are operational and readily available for the circuit card that contains the RLD.

For a better understanding of the present invention, together with other and further objects thereof, reference is made to the accompanying drawings and detailed description, and its scope will be pointed out in the appended claims.

DETAILED DESCRIPTION OF THE PREFERRED EMBODIMENTS

For clarity and ease of understanding of the present invention, the following example is presented to be helpful in obtaining a general overall understanding of the method of the invention, carried out in a manner as will be described in further detail in connection with the flow chart of FIG. 2.

Figure 1:
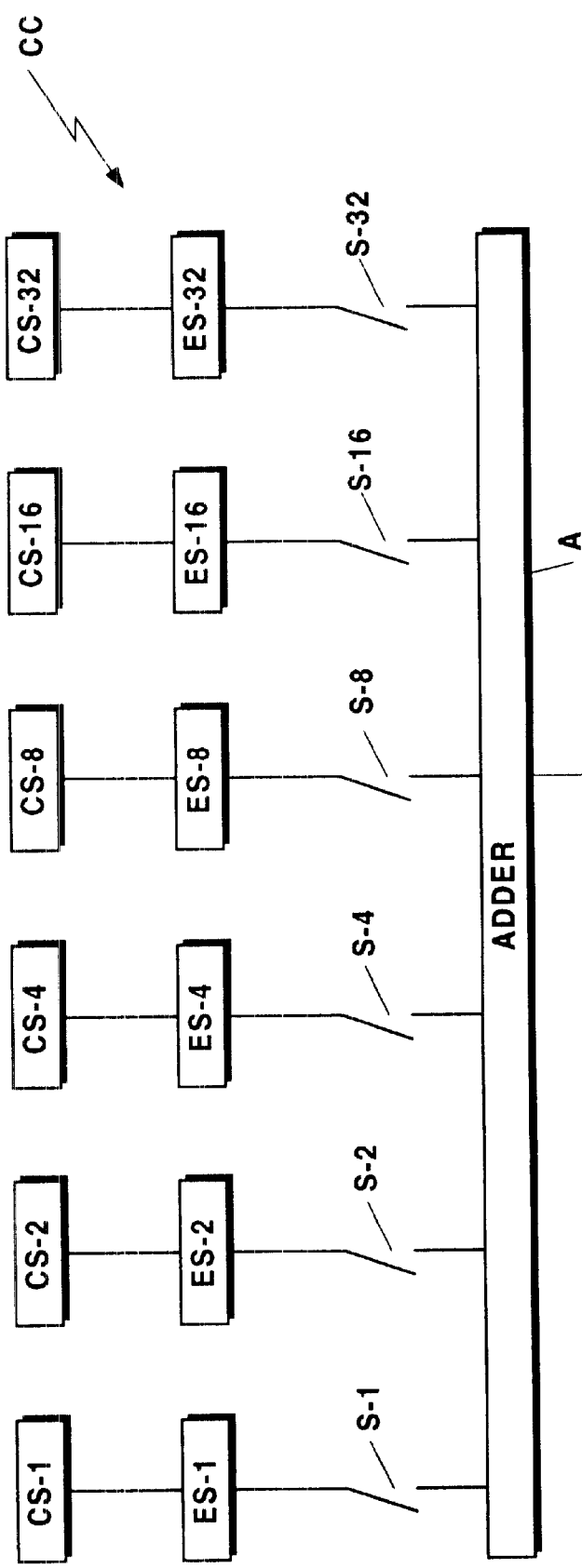
FIG. 1 is a schematic illustration of the injection of a bug into a RLD circuit in accordance with the teachings of the present invention.

For a better understanding of the present invention, reference is made to FIG. 1 which schematically discloses a hypothetical example of how the method of the invention could be used in connection with a binary to analog code converter set up within, for example a RLD which is placed upon an electronic circuit card or printed wiring board. Since current RLDs contain only digital circuitry, no analog circuitry using the output of the adder A would be present in the RLD. The code converter CC could include a bank of constant current sources CS-1, CS-2 through CS-32. CS-1 could produce one current unit, CS-2 could produce two current units and so forth through CS-32 producing a binary encoded 32-value current unit output signal. Each current source CS is coupled to a current adder circuit A so that the selective closing of various switches S-1, S-2 through S-32 will cause the adder circuit A to output a signal having a current value proportional to the binary input code established by the setting of the switches S-1 through S-32 and by the setting enabling switches ES-1 through ES 32. The output of the adder A would then feed an analog circuit (not shown) which is external to the RLD for conversion of the signal to an analog voltage.

In accordance with the concepts of the present invention, the electronic circuit card as described above, carries a readily available Reprogrammable Logic Device (RLD) which can be directly manipulated by means of the RLD vendor's software to alter the interconnections or states of switches, gates or other devices in the RLD, thus providing various customized, selected logical operations such as AND, OR, gating, adding or subtracting, registering, etc. In addition, by appropriately changing the logic within the RLD with the vendor's software, the functions of the circuit card may be directly altered by the injection of a fault into the RLD.

For example, the aforesaid code converter CC of FIG. 1 can be programmed to convert all codes up to 32 values to an analog output signal by, for example, closing all current sources' enabling switches ES-1, ES-2 through ES-32, which can couple their associated current sources CS to the switches S-1 through S-32 and thus to the adder A. Alternatively, for example, it is possible to program the RLD to disable switches ES-16 and ES-32 to decode only a 16 unit count. This disabling of ES-16 and ES-32 is simple due to the RLD's high flexibility and ease of reprogramming.

Figure 2:
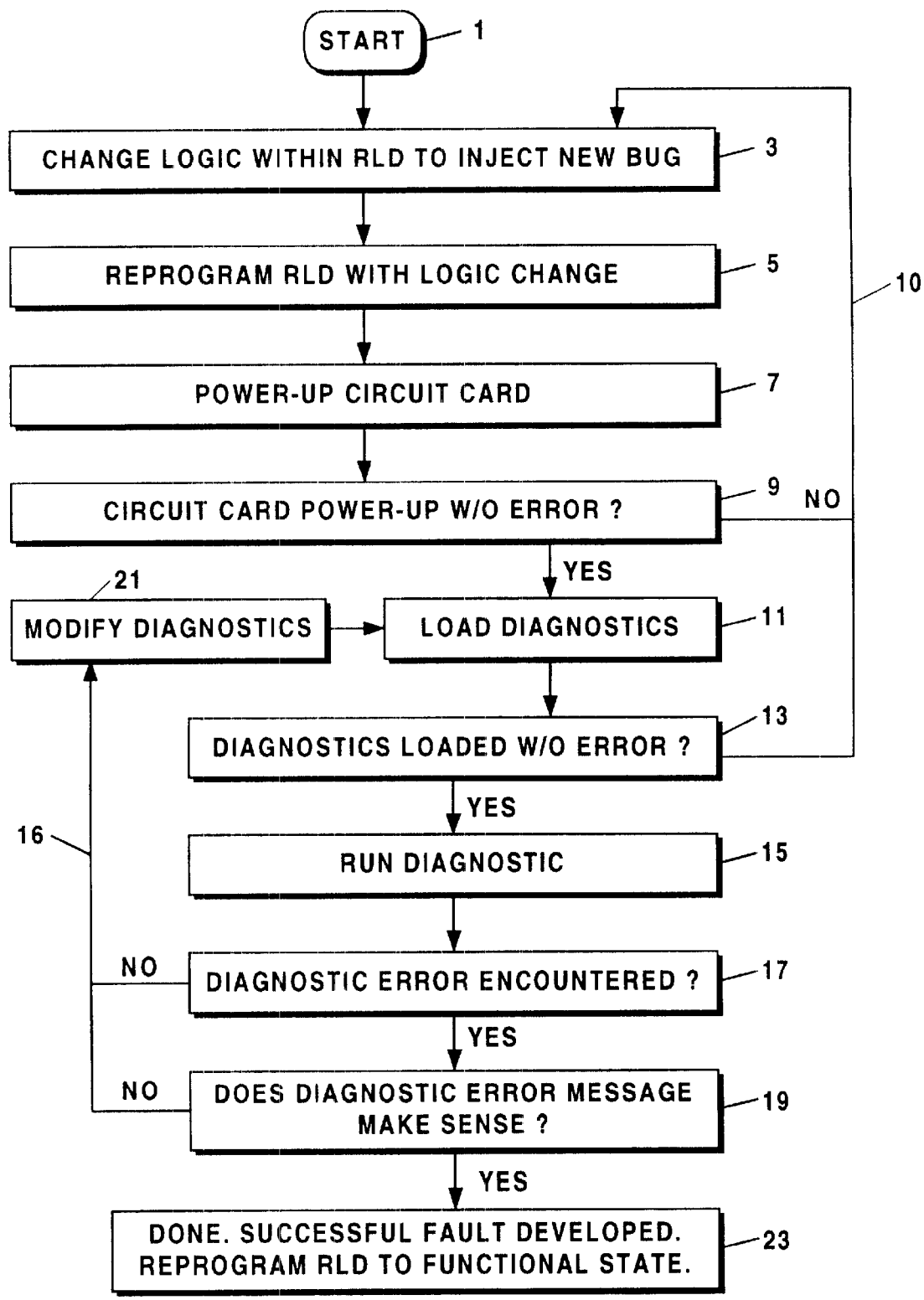
FIG. 2 is a flow chart illustrating execution of a preferred method of practicing the present invention.

Referring now to FIG. 2, taken together with FIG. 1, it is possible to change the logic within the RLD to inject a fault into the circuit card components, see FIG. 2, steps 1, 3, 5. A hypothetical fault could, for example, simulate a failure of current source CS-1 to produce or forward the one unit of current to its associated switches ES-1 and S-1 as shown in FIG. 2, step 3. The reprogramming of the RLD will result in the disabling of ES-1, FIG. 2, step 5. Assume the circuit is addressed with a binary 1111 which has the effect of closing all switches S-1 through S-8. The output of the adder A should then be fifteen (15) units, assuming no fault injection. However, the one unit of current is no longer applied to the adder A because ES-1 is disabled. Thus, the erroneous adder output is fourteen (14) rather than fifteen (15). The diagnostic program (FIG. 2, steps 11, 13, 15) encounters and identifies the error due to this discrepancy and the binary 1111 address code indicating the malfunction of CS-1, and an appropriate error code is generated (FIG. 2, steps 19 and 23) due to the detection of the fourteen (14) unit output rather than the expected fifteen (15) unit output.

Enabling switch ES-1 could again be enabled to remove the simulated fault and return the RLD code converter to its proper function. In a similar manner, various combinations of the enabling switches ES can be disabled to produce a set of similar error signals due to the detection of the aforesaid discrepancies.

With a circuit card containing at least one RLD and using conventional diagnostics software for testing, the flowchart of FIG. 2 is described more fully below illustrating the implementation of the preferred embodiment of the invention.

Details of Flow Chart of FIG. 2

Step, 1: At the start, an electronic circuit card is utilized which is complete and functional and contains an operational RLD and conventional software diagnostics for the circuit card.

Step, 3: Logic inside the RLD is analyzed by a circuit designer and a subtle fault is developed. The fault is considered subtle if it does not interfere with the circuit board's ability to power up to an operational state and if it allows software diagnostics to run. Software tools used to create the personalization file for the RLD are executed and a new RLD personalization file is created and loaded into the RLD.

Step, 5: The RLD on the circuit card is reprogrammed with the new personalization file containing the subtle fault.

Step, 7: The circuit card is powered up.

Step, 9: If the circuit card does not power up successfully, then in all likelihood the subtle fault is deficient and cannot be used, and another fault must be developed as indicated by lead line 10.

Step, 11: Upon successful power up, conventional software diagnostics are now loaded in preparation of being executed on the circuit card.

Step, 13: In most cases, the loading of the diagnostics will cause circuits on the circuit card to be operated or exercised. For instance, configuration of the circuit card's hardware may be performed during this time. It is important that the subtle fault not cause the diagnostic load to fail or erroneously load. If it fails, step 3 is repeated as indicated by lead line 10.

Step, 15: The loaded diagnostic software is now executed.

Steps, 17 and 19: If the diagnostic load fails before completion of the run, the diagnostics should encounter the injected fault and report a descriptive error message. If the fault is not encountered, or the error message is inappropriate, per step 19, then the diagnostic software will have to be modified as indicated by lead line 16.

Step, 21: Modification of the diagnostics will occur if an error is not encountered after execution following a successful load, or, following an encountered error, an error message reports inaccurate information that does not make sense.

Step, 23: Successful completion and fault, error message, and RLD personalization file are recorded for future use. The RLD can now be reprogrammed to its functional state. The steps of FIG. 2 are repeated for a second injected fault, and so on for further faults.

Most of the RLDs used today require reprogramming while the system they are incorporated in is off-line (not functioning). New RLDs are being devloped that will allow reprogramming itself "on-the-fly", in other words, while the system is operational. This invention is not limited in its applicability to either of these types of RLDs.

This invention provides substantial advantages over traditional methods of short-circuiting pins. For example, but not limited thereto:

1. Less hands-on assistance is required. Inserting the fault into the RLD is very repeatable, predictable and reliable. With traditional methods, care must be taken to insure that the part is not damaged when pins are short-circuited.

2. No extra redundant hardware needs to be purchased for specific use in the fault insertion exercise. Further damaging the PWB or chip is eliminated by the employment of this invention.

3. Potentially more faults can be derived, since there are many more wires inside the RLD than there are pins outside the RLD.

4. No extra means are required to relocate or reposition the PWB within the system. In addition, the present invention is extremely useful with designs that are space constrained.

Figure 3:
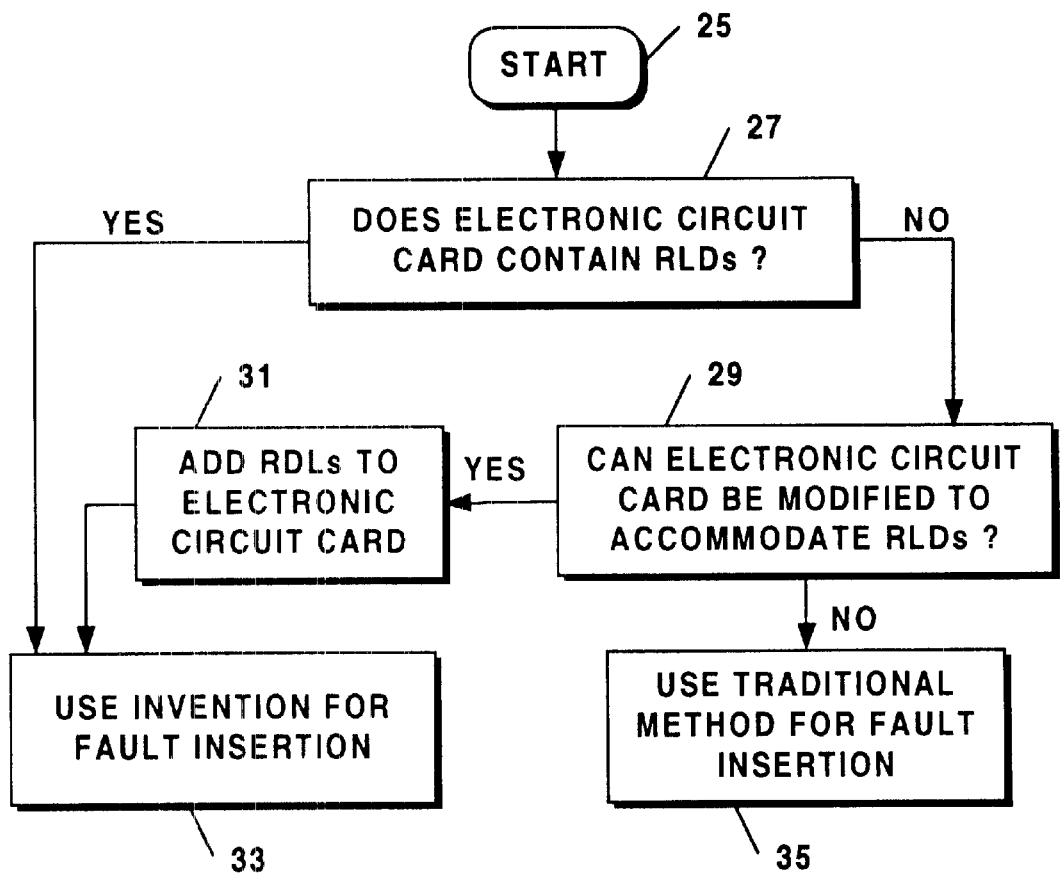
FIG. 3 is a flowchart that depicts the selection process for determining whether to use the present invention or the traditional method of fault insertion.

The flowchart of FIG. 3 can be used to determine whether to use the present invention or revert back to a more traditional method of short-circuiting pins for fault insertion. More specifically, if an electronic circuit card contains at least one RLD (see FIG. 3, blocks 25, 27 and 33), the present invention can be utilized for fault insertion. If an electronic circuit card does not contain a RLD but can be modified to accept a RLD (see FIG. 3, blocks 25, 27, 29, 31 and 33), the present invention can be utilized for fault insertion. In all other circumstances (see FIG. 3, blocks 25, 27, 29 and 35) conventional "short-circuiting" of pins is used.

Although the invention has been described with respect to various embodiments, it should be realized this invention is also capable of a wide variety of further and other embodiments within the spirit and scope of the appended claims.

What is claimed is:

1. A method of inducing a fault within a boundary of an on-card field reprogrammable logic device (RLD), comprising the steps of:
   (a) providing a circuit card containing the RLD and at least one diagnostic program for the circuit card;
   (b) reprogramming the RLD in accordance with a logic change which injects the fault within the RLD;
   (c) powering up the circuit card without error, or if powering up without error does not occur, repeat step (b); and
   (d) running the at least one diagnostic program to encounter the fault.

2. The method of claim 1, further comprising the step of modifying the at least one diagnostic program and rerunning the at least one diagnostic program in the event that no fault was encountered upon execution of step (d).

3. The method of claim 2, further comprising the step of reprogramming the RLD to its functional state, upon encountering the fault at completion of step (d).

4. The method of claim 3, further comprising the steps of repeating steps (b)–(d) for each new fault.

5. The method of claim 2, further comprising the steps of repeating steps (b)–(d) for each new fault.

6. The method of claim 1, further comprising the step of reprogramming the RLD to its functional state, upon encountering the fault at completion of step (d).

7. The method of claim 3, further comprising the steps of repeating steps (b)–(d) for each new fault.

8. The method of claim 1, further comprising the steps of repeating steps (b)–(d) for each new fault.

9. A method of inducing a fault within a boundary of an on-card field reprogrammable logic device (RLD), comprising the steps of:
   (a) providing a circuit card containing the RLD and at least one diagnostic program for the circuit card;
   (b) changing logic within the RLD to inject the fault therein;
   (c) reprogramming the RLD in accordance with the logic change induced by step (b);
   (d) powering up the circuit card without error, or if powering up without error does not occur, repeat step (b);
   (e) running the at least one diagnostic program;
   (f) generating a diagnostic error message if step (e) resulted in encountering an error;
   (g) determining if the diagnostic error message is logical if step (e) resulted in encountering the error;
   (h) ending the at least one diagnostic program if the diagnostic error message of step (f) is logical; and
   (i) modifying the at least one diagnostic program and rerunning the modified diagnostic program in accordance with step (e) if no error message was reported, or if the diagnostic error message of step (f) is illogical.

10. The method of claim 9, further comprising the step of reprogramming the RLD to its functional state, upon completion of step (h).

11. The method of claim 9, further comprising the steps of repeating steps (b)–(i) for each new fault.

12. The method of claim 10, further comprising the steps of repeating steps (b)–(i) for each new fault.

13. A method of inducing a fault within the boundary of an on-card field reprogrammable logic device (RLD) comprising the steps of:
   (a) providing a circuit card containing a RLD and at least one diagnostic program for the circuit card;
   (b) reprogramming a personalization file of the RLD on the circuit card to inject a subtle fault therein;
   (c) powering up the circuit card;
   (d) loading the at least one diagnostic program upon successful power up;
   (e) discarding the subtle fault and repeating step (b) to inject a new subtle fault upon failure of power up;
   (f) running the at least one diagnostic program if the at least one diagnostic program is loaded without error;
   (g) repeating step (b) if the at least one diagnostic program is loaded with error;
   (h) modifying, reloading, and rerunning the at least one diagnostic program if the subtle fault is not encountered during the running of the at least one diagnostic program, or if an error message generated by the at least one diagnostic program is inappropriate; and
   (i) recording the subtle fault and the error message if during running of the at least one diagnostic program the subtle fault is encountered, and if an appropriate error message is generated by the at least one diagnostic program.

14. The method of claim 13 further comprising, the step of reprogramming the RLD to its functional state.

15. The method of claim 14 further comprising the steps of repeating steps (b)–(i) for each new subtle fault.

16. The method of claim 13 further comprising the steps of repeating steps (b)–(i) for each new subtle fault.

* * * * *

UNITED STATES PATENT AND TRADEMARK OFFICE
CERTIFICATE OF CORRECTION

PATENT NO. : 6,704,894 B1
DATED : March 9, 2004
INVENTOR(S) : Michael J. Kania

Page 1 of 1

It is certified that error appears in the above-identified patent and that said Letters Patent is hereby corrected as shown below:

Column 5,
Line 50, the claim dependency "claim 3" should read -- claim 6 --.

Signed and Sealed this

Twenty-ninth Day of June, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,704,894 B1
DATED : March 9, 2004
INVENTOR(S) : Michael J. Kania

Page 1 of 1

It is certified that error appears in the above-identified patent and that said Letters Patent is hereby corrected as shown below:

<u>Column 5,</u>
Line 50, the claim dependency "claim 3" (as deleted by Certificate of Correction issued June 29, 2004) should be reinstated.
Line 57, the claim dependency "claim 3" should read -- claim 6 --.

Signed and Sealed this

Tenth Day of August, 2004

JON W. DUDAS
*Acting Director of the United States Patent and Trademark Office*